(12) United States Patent
Yamazaki et al.

(10) Patent No.: US 6,936,485 B2
(45) Date of Patent: Aug. 30, 2005

(54) METHOD OF MANUFACTURING A LIGHT EMITTING DEVICE

(75) Inventors: Shunpei Yamazaki, Tokyo (JP); Takeshi Fukunaga, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/815,661

(22) Filed: Mar. 23, 2001

(65) Prior Publication Data

US 2001/0026846 A1 Oct. 4, 2001

(30) Foreign Application Priority Data

Mar. 27, 2000 (JP) .................................... 2000-085917

(51) Int. Cl.⁷ .............................................. H01L 21/20
(52) U.S. Cl. ........................... 438/22; 438/798; 438/99
(58) Field of Search .............................. 438/22–47, 99, 438/798; 313/501, 500, 502, 503, 504, 505, 506; 315/169.3; 257/448; 427/539, 569, 402, 255, 162; 428/690, 691, 917

(56) References Cited

U.S. PATENT DOCUMENTS

| | | | |
|---|---|---|---|
| 4,613,382 A * | 9/1986 | Katayama et al. ............. 427/86 |
| 4,885,211 A | 12/1989 | Tang et al. .................. 428/457 |
| 5,047,687 A | 9/1991 | Van Slyke .................. 313/503 |
| 5,641,991 A | 6/1997 | Sakoh ........................ 257/755 |
| 5,652,067 A * | 7/1997 | Ito et al. ..................... 428/690 |
| 5,684,365 A | 11/1997 | Tang et al. ............... 315/169.3 |
| 5,882,761 A | 3/1999 | Kawami et al. .............. 428/69 |
| 6,010,796 A * | 1/2000 | Kijima ........................ 428/690 |
| 6,064,151 A | 5/2000 | Choong et al. ............. 313/504 |
| 6,114,088 A | 9/2000 | Wolk et al. ............... 430/273.1 |
| 6,137,223 A | 10/2000 | Hung et al. ................. 313/506 |
| 6,169,359 B1 | 1/2001 | Sun et al. ................... 313/503 |
| 6,188,134 B1 | 2/2001 | Stumborg et al. ........... 257/751 |
| 6,221,701 B1 | 4/2001 | Yamazaki ................... 438/166 |
| 6,259,138 B1 | 7/2001 | Ohtani et al. ............... 257/351 |
| 6,259,202 B1 * | 7/2001 | Sturm et al. ................ 313/504 |
| 6,278,236 B1 | 8/2001 | Madathil et al. ............ 313/504 |
| 6,361,886 B2 * | 3/2002 | Shi et al. .................... 428/690 |
| 6,420,834 B2 * | 7/2002 | Yamazaki et al. ....... 315/169.3 |
| 6,620,528 B1 | 9/2003 | Yamazaki et al. |

| | | | |
|---|---|---|---|
| 2002/0054268 A1 * | 5/2002 | Kim et al. ................. 349/158 |
| 2002/0090831 A1 * | 7/2002 | Yoshida et al. |
| 2004/0028807 A1 | 2/2004 | Yamazaki et al. |

FOREIGN PATENT DOCUMENTS

| | | |
|---|---|---|
| EP | 0717 445 | 6/1996 |
| EP | 0776 147 | 5/1997 |
| JP | 01274385 | * 11/1989 |
| JP | 8-078519 | 3/1996 |
| JP | 8-241048 | 9/1996 |
| JP | 9-148066 | 6/1997 |
| JP | 10-225312 | * 7/1998 |

OTHER PUBLICATIONS

Baldo et al, "Very high effciency green organic light–emitting devcies based on electrophophorescence", appplied Physics Letters, vol. 75, pp. 4–6.*
T. Kofuji, "Development of Organic EL Element To Single Layer Tape", Electronic Journal 6$^{th}$ FPD Seminar, p. 83–88.
Tsutsui, T., et al, "Electroluminescence in Organic Thin Films," Photochemical Processes in Organized Molecular Systems, pp. 437–450, 1991.
Baldo, M.A. et al, "Highly Efficient Phosphorescent Emission from Organic Electroluminescent Devices," vol. 395, pp. 151–154, Sep., 1998.
Baldo, M.A. et al, "Very High–Efficiency Green Organic Light–Emitting Devices Based on Electrophosphorescence," Applied Physics Letters, vol. 75, No. 1, pp. 4–6, Jul. 5, 1999.
Tsutsui, T. et al, High Quantum Efficiency in Organic Light–Emitting Devices with Iridium–Complex as a Triplet Emissive Center, Japanese Journal of Applied Physics, vol. 38, part 2, No. 12B, pp. L1502–L1504, Dec. 15, 1999.

* cited by examiner

*Primary Examiner*—Savitri Mulpuri
(74) *Attorney, Agent, or Firm*—Cook, Alex, McFarron, Manzo, Cummings & Mehler, Ltd.

(57) ABSTRACT

To reduce the number of layers of an EL layer so that it can be manufactured at a reduced cost. An electrode (a) (102) and an EL layer (103) are formed on an insulator (101), and the EL layer (103) is subjected to plasma processing. A carrier injection region (104) is formed as a result in a superficial portion of the EL layer (103). An electrode (b) (105) is formed thereon to complete an EL element. The EL layer (103) is high in carrier injection efficiency despite being substantially a single layer.

8 Claims, 10 Drawing Sheets

METHOD OF MANUFACTURING A LIGHT EMITTING DEVICE

BACKGROUND OF THE INVENTION

1. Field of the Invention

The present invention relates to a device having an element that is composed of a luminous material sandwiched between electrodes (hereinafter referred to as light emitting element) (the device will be called a light emitting device), and to a method of manufacturing the same. The invention particularly relates to a light emitting device using a light emitting element formed of a luminous material that provides EL (Electro Luminescence) (hereinafter the material and the element are referred to as EL material and EL element, respectively). This device will be called an EL light emitting device. Note that the light emitting device of the present invention includes an organic EL display and an organic light emitting diode (OLED).

EL materials usable in the present invention include every luminous material that emits light (phosphorescence and/or fluorescence) through one or both of singlet excitation and triplet excitation.

2. Description of the Related Art

An EL light emitting device has an EL element structured to have an EL material film (hereinafter referred to as EL film) sandwiched between an anode and a cathode. A voltage is applied between the anode and the cathode to cause a current to flow through the EL film, whereby carriers are recombined and the element emits light. In other words, an EL light emitting device is capable of emitting light by itself owing to the light emitting element included therein, and hence the device does not need any backlight unlike a liquid crystal display device. Furthermore, the EL light emitting device has advantages in that the viewing angle is wider and it weighs lighter.

The mainstream structure of an EL layer for an EL element is currently a laminate structure proposed by Tang, et al. with Eastman Kodak Company which has three to four layers. This structure is characterized in that the EL layer is divided Into an electric charge transportation layer and a light emitting layer by their functions. The term EL layer herein refers to both a single layer of EL film and a laminate in which the EL film and other organic films or inorganic films are layered.

Recently, however, concern has been expressed about an increase in manufacture cost due to complication of the manufacturing process which is brought by the multilayered EL element. In the wake of this concern, attempts have been made to reduce the number of layers that constitute the EL layer by doping a light emitting layer with a specific impurity element so that the light emitting layer can also serve as an electron transportation layer and an electron injection layer.

For instance, Idemitsu Kosan Co., Ltd. has proposed to dope a superficial region of a light emitting layer (distyryl arylene derivative) with cesium (Cs) or like other low work function elements by coevaporation so that the doped region can be used as an electron transportation layer (The $6^{th}$ FPD Seminar Preliminaries, pp. 83–88, hosted by Journal of Computer Aided Chemistry).

SUMMARY OF THE INVENTION

The present invention has been made in view of the above problem in multi-layering an EL element, and an object of the present invention is therefore to provide a technique for reducing the number of layers of an EL element while maintaining, or even improving, the performance of the EL element.

Another object of the present invention is to reduce cost in manufacturing an EL light emitting device and provide an inexpensive EL light emitting device. The present invention has still another object of reducing the product cost of an electric machine that employs the inexpensive EL light emitting device as a display unit.

The present invention is characterized in that an EL layer is partially doped with an element for promoting a specific effect (hereinafter referred to as specific element) and the doped region is used as a carrier injection region, a carrier transportation region, or a carrier blocking region, to thereby reduce the number of layers that constitute the EL layer. The invention is also characterized by employing plasma processing to dope the layer with the specific element.

According to the present invention, all of the processing is conducted under highly vacuumed state or in inert atmosphere so as not to degrade the EL layer. This makes it possible to enhance the ability of the EL layer in transporting holes or electrons without degrading the EL layer. Therefore, a film forming apparatus of multi-chamber system (also known as cluster tool system) with various processing chambers coupled into one apparatus, or a film forming apparatus of inline system is desirable in forming the EL layer and subjecting the layer to plasma processing.

FIGS. 1A to 1D show an example of typically embodied present invention. The process shown in FIGS. 1A to 1C is of a case where a carrier injection region is formed in an EL layer by carrying out the present invention.

First, as shown in FIG. 1A, an electrode (a) 102 is formed on an insulator 101. The insulator 101 may either be an insulating film or an insulating substrate. The electrode (a) 102 serves as an anode or cathode of an EL element, and is formed from a conductive film having a work function of 4.5 to 5.5 if it is to serve as the anode and from a conductive film having a work function of 2.0 to 3.5 if it is to serve as the cathode. The electrode (a) 102 has a thickness of 100 to 300 nm (preferably, 120 to 200 nm).

An EL layer 103 is then formed on the electrode (a) 102. The EL layer 103 can be formed from an organic EL material or an inorganic EL material. If an organic EL material is chosen, either of a polymer EL material and a monomer EL material can be used. Whatever material is used to form the EL layer 103, the spirit of the present invention is not altered by the choice. Therefore, the EL layer 103 can be formed from any known material. The thickness of the EL layer is from 30 to 150 nm (preferably, 50 to 80 nm).

Next, as shown in FIG. 1B, plasma processing is performed on the EL layer 103 so that the layer is doped with a specific element. The specific element herein refers to an element that provides the EL layer with a specific effect when contained in the EL layer. Specifically, it is an element that shows an effect of enhancing the ability of the EL layer in carrier injection, in transporting carriers, and in blocking carriers.

The EL layer here is doped with an element for enhancing its ability in carrier injection to form therein a carrier injection region 104. The element for helping the EL layer with carrier injection ability is an element belonging to Group 1 or 2 in the periodic table if it is electron injection ability that is to be enhanced. If it is hole injection ability that is desired to be enhanced, the specific element is halogen.

Plasma processing is employed as a doping method. To elaborate, gas containing the specific element is ionized to generate plasma, and the EL layer 103 is exposed to the generated plasma. An advantage of the plasma processing lies in surface deposition in which the specific element deposits on the surface of the EL layer, or in selective doping that allows the specific element to reach only a superficial region of the EL layer, namely, as far as 0.5 to 10 nm (preferably 1 to 3 nm) from the surface. The depth the specific element is allowed to reach can be controlled by adjusting the RF power during the plasma processing.

FIG. 1D shows the concentration profile by SIMS (secondary ion mass spectroscopy) in the laminate structure composed of the electrode (a) 102, the EL layer 103 and an electrode (b) 105 when the EL layer is doped with the specific element through plasma processing.

After thus doping the EL layer 103 with the specific element through the plasma processing, the electrode (b) 105 is formed as shown in FIG. 1C. The electrode (b) 105 serves as an anode or cathode of the EL element, and is formed from a conductive film having a work function of 4.5 to 5.5 if it is to serve as the anode and from a conductive film having a work function of 2.0 to 3.5 if it is to serve as the cathode. The electrode (b) 105 has a thickness of 100 to 300 nm (preferably, 120 to 200 nm).

Now the EL element composed of the electrode (a) 102, the EL layer 103 (including the carrier injection region 104), and the electrode (b) 105 is completed.

A description is given with reference to FIGS. 2A to 2C on an example of the case where the EL layer is doped with an element for providing the EL layer with an effect of enhancing the carrier blocking ability thereof. The feature of this example is to conduct plasma processing in the middle of the formation of the EL layer.

First, an electrode (a) 202 is formed on an insulator 201 as shown in FIG. 2A. On the electrode (a) 202, an EL layer 203 is then formed halfway through completion. The uncompleted EL layer 203 is subjected to the plasma processing to dope the EL layer 203 with a specific element. An element for helping the EL layer with its ability of blocking carriers is used here to form a carrier blocking region (a) 204 in the layer.

The carrier blocking ability is brought by an element that acts to inhibit the movement of carriers, and the element forms a region for capturing carriers by changing the band gap of the EL layer or a region that stands against carriers. Although the carrier blocking region (a) 204 has no influence over carriers that are injected from the electrode (a) 202, it blocks carriers that are injected from an electrode (b) 206.

Next, as shown in FIG. 2B, the EL layer 203 is again formed on the carrier blocking region (a) 204. The EL layer 203 is then subjected to the plasma processing to dope the EL layer 203 with a specific element. The specific element here is again an element for helping the EL layer with its carrier blocking ability, and a carrier blocking region (b) 205 is formed as a result of the doping. Although the carrier blocking region (b) 205 has no influence over carriers that are injected from the electrode (b) 206, it blocks carriers that are injected from the electrode (a) 202.

As shown in FIG. 2C, the rest of the EL layer 203 is then formed on the carrier blocking region (b) 205. The electrode (b) 206 is formed thereon. Now the EL element composed of the electrode (a) 202, the EL layer 203 (including the carrier blocking region (a) 204 and the carrier blocking region (b) 205), and the electrode (b) 206 is completed.

Shown here is an example in which two carrier blocking regions are formed, but only one of them may be provided. Also, it is possible to combine this example with the configuration shown in FIGS. 1A to 1C. The EL layer of this example may be combined with a known carrier transportation layer or carrier injection layer.

When a carrier blocking layer is formed through the manufacturing process shown in FIGS. 2A to 2C, an EL element having the band structure as the one shown in FIG. 3A is obtained. Namely, electrons and holes that are carriers are trapped in specific regions to increase the recombination percentage, whereby efficiency in recombination can be enhanced.

In FIG. 3A, reference symbol 301 denotes a cathode, 302, an electron transportation layer, 303, a light emitting layer, 304, a hole transportation layer, and 305, an anode. The electron transportation layer 302, the light emitting layer 303 and the hole transportation layer 304 together correspond to the EL layer 203 of FIGS. 2A to 2C. The light emitting layer 303 has an electron trap region 306 and a hole trap region 307 formed therein. The electron trap region 306 corresponds to the carrier blocking region (a) 204 or the carrier blocking region (b) 205 of FIGS. 2A to 2C. The hole trap region 307 corresponds to one of those carrier blocking regions that is not equal to the electron trap region 306.

The electron trap region 306 is a region having an effect of containing, in the light emitting layer 303, electrons that have been transported on the lowest unoccupied molecule orbital (LUMO) level of the light emitting layer, and the region has an LUMO level lower than the LUMO level of the light emitting layer 303. The hole trap region 307 is a region having an effect of containing, in the light emitting layer 303, holes that have been transported on the highest occupied molecule orbital (HOMO) level of the light emitting layer, and the region has an HOMO level higher than the HOMO level of the light emitting layer 303.

The electron trap region 306 can be formed through doping using an element that lowers the LUMO level of the light emitting layer 303. The hole trap region 307 can be formed through doping using an element that increases the HOMO level of the light emitting layer 303.

With the band structure illustrated in FIG. 3A, carriers are injected following the process shown in FIG. 3B. Specifically, electrons 308 that have been transported on the LUMO level are trapped in the electron trap region 306 provided inside the light emitting layer 303. On the other hand, holes 309 that have been transported on the HOMO level are trapped in the hole trap region 307. As a result, the electrons 308 and the holes 309 are recombined between the electron trap region 306 and the hole trap region 307 to emit light. The recombination takes place while the electrons and the holes are contained in their respective trap regions in the present invention. Therefore the present invention can improve the recombination efficiency compared with the prior art.

The improved recombination efficiency makes it possible to set the drive voltage for the EL element lower than in prior art to obtain the same level of luminance as the prior art, whereby the power consumption of the light emitting device can be reduced. The lowered drive voltage also controls degradation of the EL layer, thereby enhancing the reliability of the device,

DETAILED DESCRIPTION OF THE PREFERRED EMBODIMENTS

Modes for carrying out the present invention will be described in detail through embodiments below.

Embodiment 1

Embodiment 1 gives a description of a case of applying the present invention to an active matrix EL light emitting device that transmits light toward the pixel electrode side. First, p-channel TFTs 402 and 403 are formed by a known method on a substrate 401 having an insulating film formed on its surface. Although given as an example in this embodiment is a planar type TFT, the structure of the TFTs is not limited thereto. A reverse stagger type TFT can also be used.

Figure 4A:
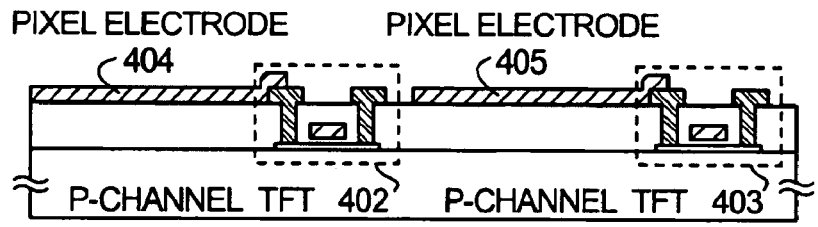
FIGS. 4A to 4D are diagrams showing a process of manufacturing a light emitting device.

Formed next are pixel electrodes 404 and 405 electrically connected to the p-channel TFTs 402 and 403, respectively. The pixel electrodes 404 and 405 are formed from a material having a large work function, for they function as anodes of EL elements. Accordingly this embodiment employs a conductive oxide film transparent with respect to a visible ray (a film formed of indium oxide, tin oxide, or zinc oxide, or a compound film containing these oxides in combination). The conductive oxide film may be doped with gallium. (FIG. 4A)

Figure 4B:
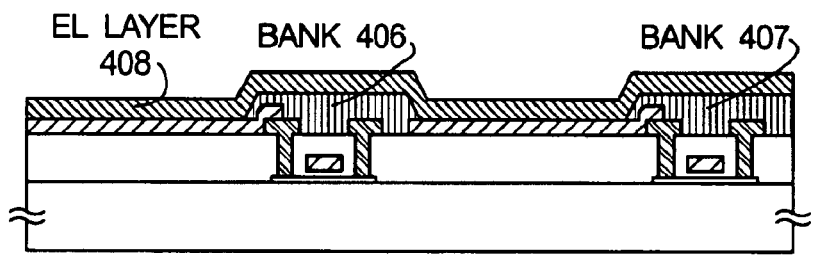

Then banks 406 and 407 are formed from a resin film so as to surround the ends of the pixel electrodes 404 and 405. An EL layer 408 is formed thereon. In this embodiment, the banks 406 and 407 are formed of an acrylic resin film and the EL layer 408 is formed by spin coating. A material used for the EL layer 408 is polyfluorene that is a polymer organic material. Polyfluorene may of course be doped with a fluorescent substance to control chromaticity. (FIG. 4B)

Figure 4C:
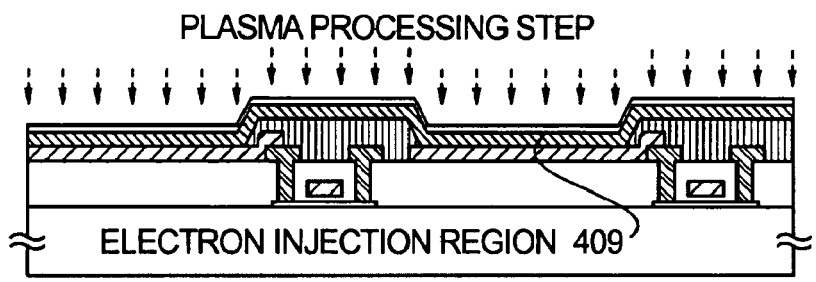

The EL layer 408 is then subjected to plasma processing to form an electron injection region 409. The plasma processing is made by filling the processing chamber with gas containing an element belonging to Group 1 or 2 in the periodic table (typically lithium, beryllium, sodium, magnesium, kalium, calcium, cesium, or barium) to generate plasma between the electrodes and expose the EL layer 40B to the generated plasma. During the plasma processing, the electrodes are desirably cooled in order to prevent an increase in temperature of the EL layer 408. (FIG. 4C)

An alloy film is formed next by coevaporation from aluminum and lithium as a cathode 410 to a thickness of 300 nm. A passivation film 411 is formed thereon from a silicon nitride film by sputtering. It is also effective to laminate a carbon film, specifically, a DLC (diamond-like carbon) film on the passivation film.

Figure 4D:
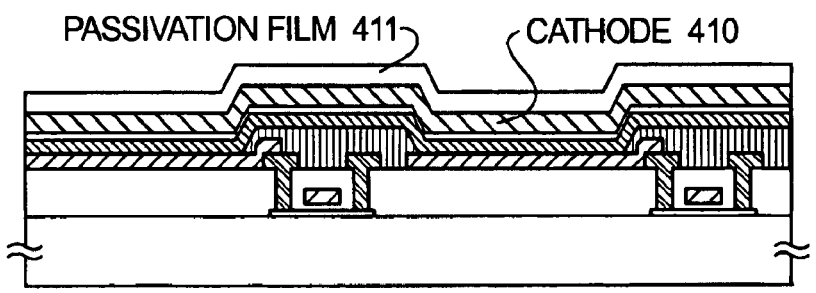

A light emitting device structured as shown in FIG. 4D is thus completed. Thereafter, the EL element is enclosed with a resin or put in an air-tight space in order to protect the EL element against exposure to the outside air. The EL light emitting element thus obtained is high in yield because its manufacturing process is simplified, and the amount of EL material it requires is smaller than the prior art to reduce cost in manufacture.

Figure 1A:
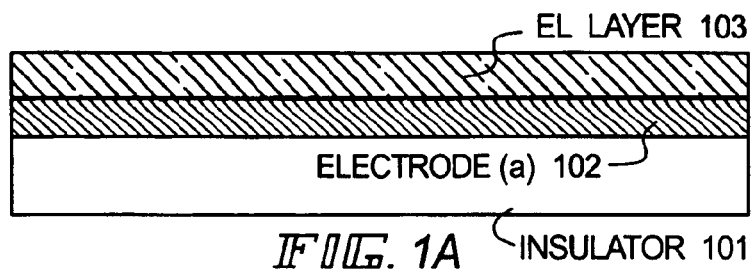
FIGS. 1A to 1C are diagrams showing a process of manufacturing an EL layer and FIG. 1D is a graph showing the concentration profile thereof by SIMS.
Figure 1B:
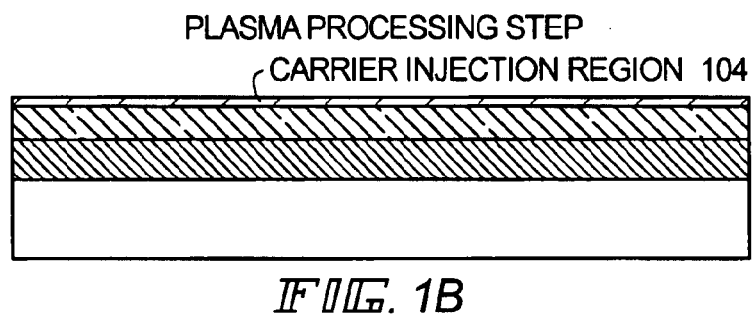
Figure 1C:
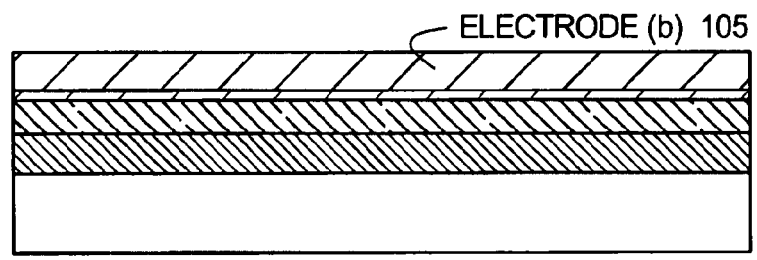
Figure 1D:
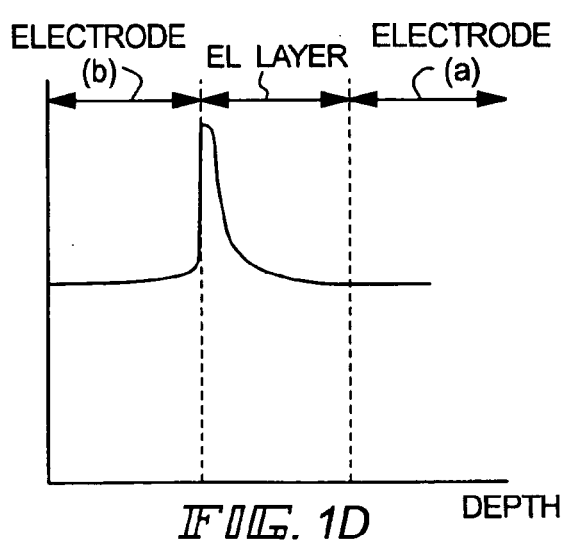
Figure 2A:
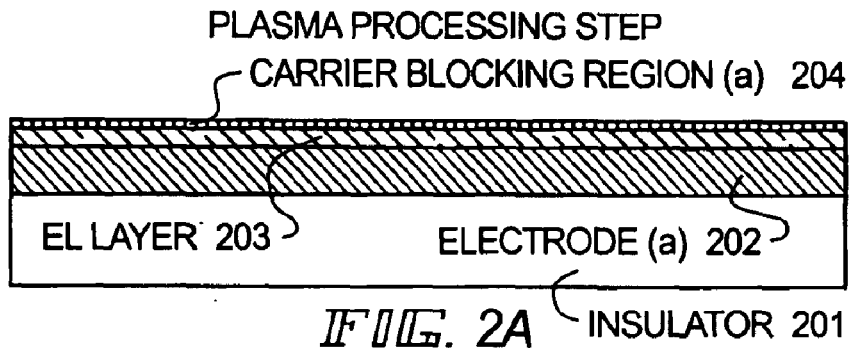
FIGS. 2A to 2C are diagrams showing another process of manufacturing an EL layer.
Figure 2B:
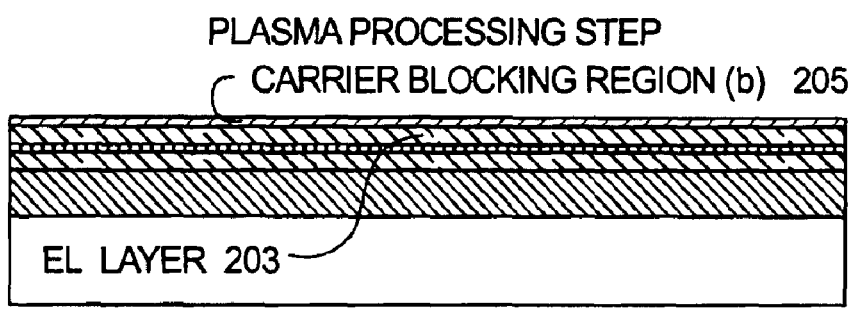
Figure 2C:
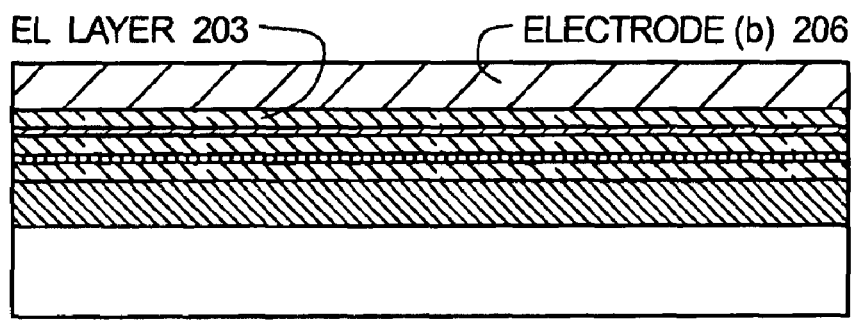
Figure 3A:
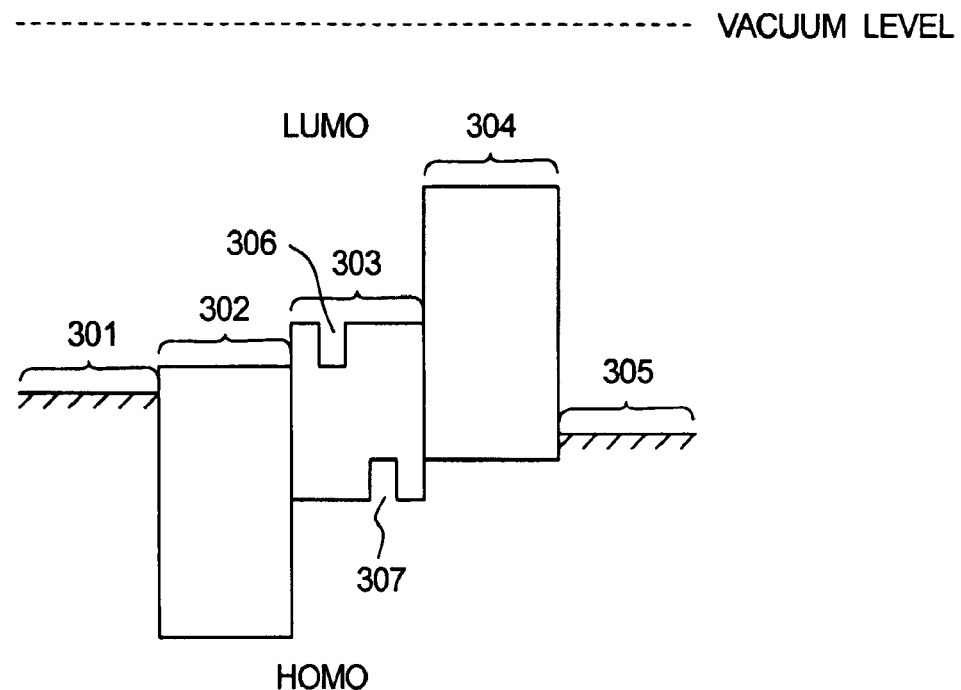
FIGS. 3A and 3B are diagrams showing the band structure of an EL element.
Figure 3B:
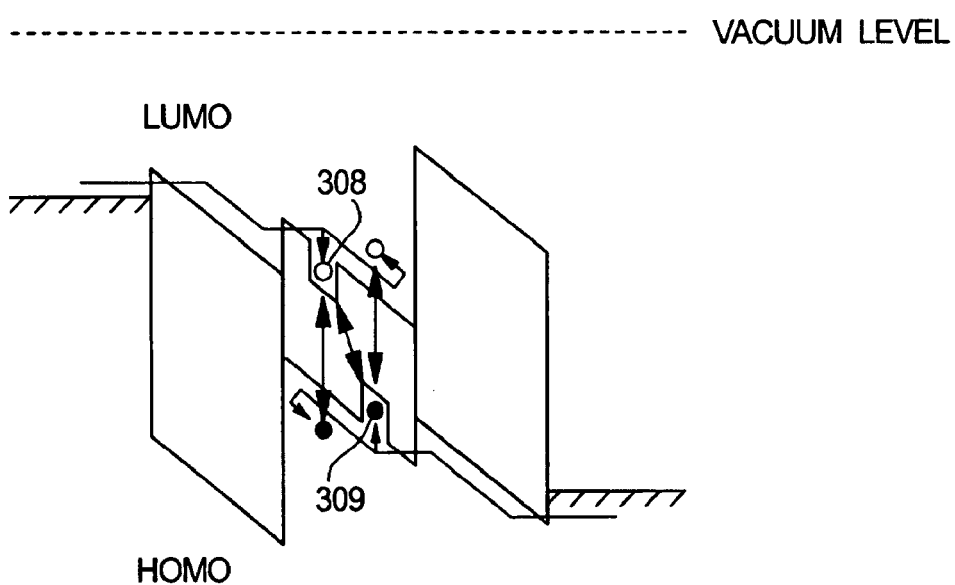

Shown in this embodiment is a case of employing the structure illustrated in FIGS. 1A to 1C for an active matrix light emitting device. However, the EL layer 408 may take the structure illustrated in FIGS. 2A to 2C.

A polarizing plate may be provided on a display screen (the screen for viewing an image) of the light emitting device according to this embodiment. The polarizing plate has an effect of limiting reflection of incident light from the outside to thereby prevent the shadow of a viewer from being cast on the display screen. A circular polarizing plate is generally used. Desirably, however, the reflectance is adjusted so as to reduce the internal reflection in order to prevent the polarizing plate from reflecting light that is emitted from the EL layer and sending it back to the inside.

Embodiment 2

Embodiment 2 gives a description of a case of applying the present invention to an active matrix EL light emitting device that reflects light on the pixel electrode side. First, n-channel TFTs 502 and 503 are formed by a known method on a substrate 501 having an insulating film formed on its surface. Although given as an example in this embodiment is a planar type TFT, the structure of the TFTs is not limited thereto. A reverse stagger type TFT can also be used.

Figure 5A:
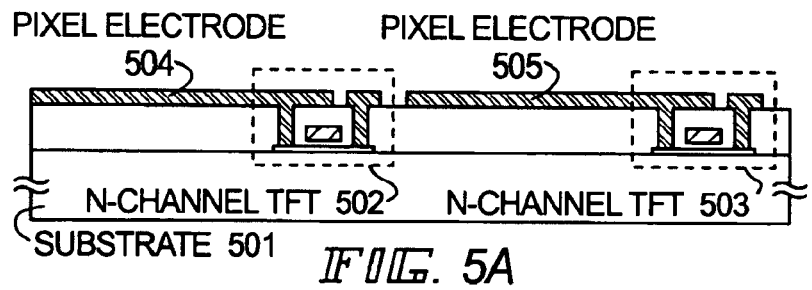
FIGS. 5A to 5D are diagrams showing another process of manufacturing a light emitting device.

Drain wirings of the n-channel TFTs 502 and 503 are used as pixel electrodes 504 and 505, respectively. The pixel electrodes 504 and 505 in this embodiment have to reflect emitted light and hence a highly reflective metal material is used for the pixel electrodes 504 and 505. The metal material used also has to have a small work function, for the pixel electrodes function as cathodes of EL elements as well. Accordingly this embodiment employs an alloy film containing aluminum and lithium. (FIG. 5A)

Figure 5B:
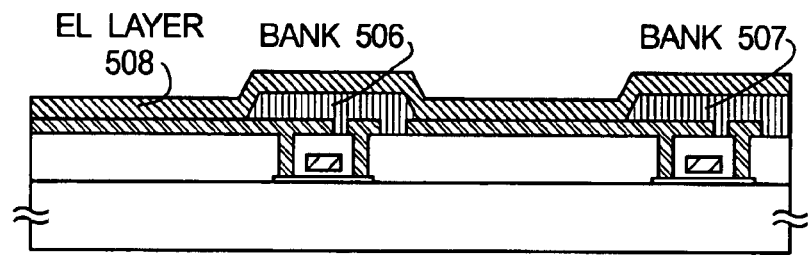

Then banks 506 and 507 are formed from a resin film so as to surround the ends of the pixel electrodes 504 and 505. An EL layer 508 is formed thereon. In this embodiment, the banks 506 and 507 are formed of an acrylic resin film and the EL layer 508 is formed by evaporation. A material used for the EL layer 508 is Alq$_3$ (tris-8-quinolinolate aluminum complex) that is a monomer organic material. Alq$_3$ may of course be doped with a fluorescent substance to control chromaticity. (FIG. 5B)

Figure 5C:
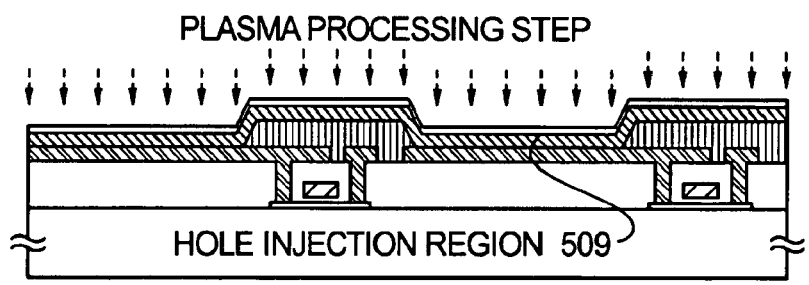

The EL layer 508 is then subjected to plasma processing to form a hole injection region 509. The plasma processing is made by filling the processing chamber with gas containing a halogen element (typically fluorine, chlorine, bromine or iodine) to generate plasma between the electrodes and expose the EL layer 508 to the generated plasma. During the plasma processing, the electrodes are desirably cooled in order to prevent an increase in temperature of the EL layer 508. (FIG. 5C)

A conductive oxide film containing zinc oxide and doped with gallium oxide is formed next as an anode 510 to a thickness of 300 nm. A passivation film 511 is formed thereon from a silicon nitride film by sputtering. It is also effective to laminate a carbon film, specifically, a DLC (diamond-like carbon) film on the passivation film.

Figure 5D:
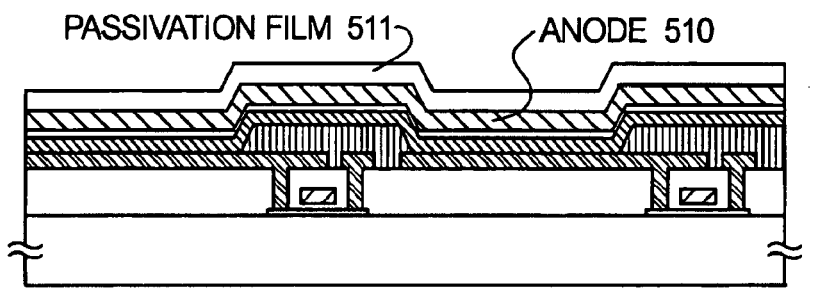

A light emitting device structured as shown in FIG. 5D is thus completed. Thereafter, the EL element is enclosed with a resin or put in an air-tight space in order to protect the EL element against exposure to the outside air. The EL light emitting element thus obtained is high in yield because its manufacturing process is simplified, and the amount of EL material it requires is smaller than the prior art to reduce cost in manufacture.

Shown in this embodiment is a case of employing the structure illustrated in FIGS. 1A to 1C for an active matrix light emitting device. However, the EL layer 508 may take the structure illustrated in FIGS. 2A to 2C.

Embodiment 3

Figure 6A:
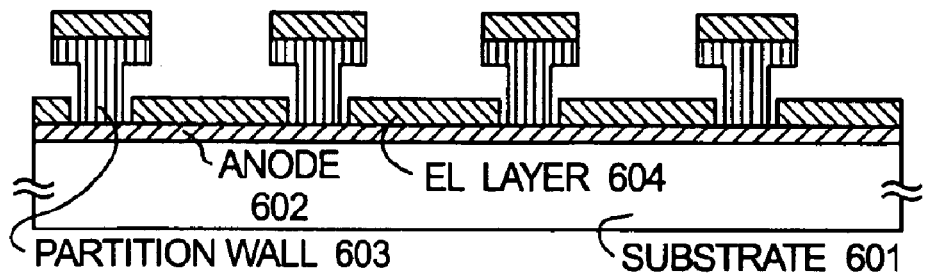
FIGS. 6A to 6C are diagrams showing still another process of manufacturing a light emitting device.

Embodiment 3 will describe a case of applying the present invention to a passive matrix EL light emitting device that irradiates light through a substrate. First, an anode 602 is formed on a substrate 601 having an insulating film formed on its surface. Used in this embodiment as the anode 602 is a conductive oxide film formed of a compound of indium oxide and tin oxide. (FIG. 6A)

The anode 602 is formed like slips each extending along the width of the drawing. The slips are arranged into a stripe pattern with its stripes laid one after another along the depth of the drawing. This structure is equal to the known passive matrix light emitting device.

Next, partition walls 603 are formed perpendicular to the stripes of the anode 602. The partition walls 603 are provided to separate a metal film that is to serve as a cathode. A two-layer resin film is used for each partition wall of this embodiment, and the wall is shaped to form a letter T in section. This structure can be obtained by etching its lower layer at a higher etching rate than in etching its upper layer.

An EL layer 604 is formed next. The EL layer 604 in this embodiment is formed by evaporation. A material used for the EL layer 604 is Alq$_3$ (tris-8-quinolinolate aluminum complex) that is a monomer organic material. Alq$_3$ may of course be doped with a fluorescent substance to control chromaticity.

Figure 6B:
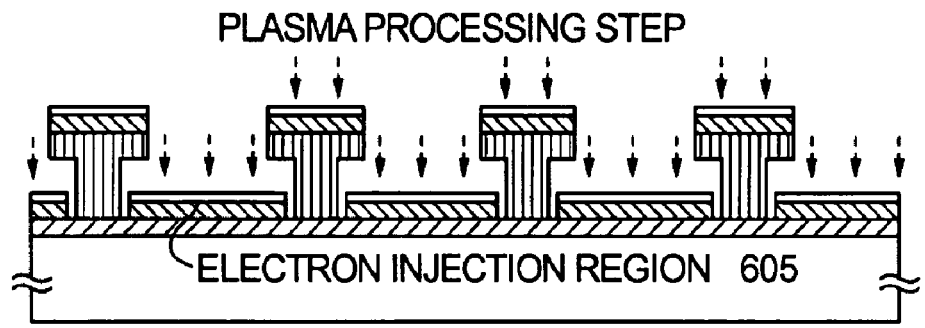

The EL layer 604 is then subjected to plasma processing to form an electron injection region 605. The plasma processing is made by filling the processing chamber with gas containing an element belonging to Group 1 or 2 in the periodic table (typically lithium, beryllium, sodium, magnesium, kalium, calcium, cesium, or barium) to generate plasma between the electrodes and expose the EL layer 604 to the generated plasma. During the plasma processing, the electrodes are desirably cooled in order to prevent an increase in temperature of the EL layer 604. (FIG. 6B)

An alloy film is formed next by coevaporation from aluminum and lithium as a cathode 606 to a thickness of 300 nm. At this point, the cathode 606 is formed into strips each extending along the depth of the drawing and separated from one another by the partition walls 603. The strips of the cathode are laid one after another along the width of the drawing, forming a strips pattern. A passivation film 607 is formed thereon from a resin film by the ink jet method or printing. It is also effective to laminate a carbon film, specifically, a DLC (diamond-like carbon) film on the passivation film.

Figure 6C:
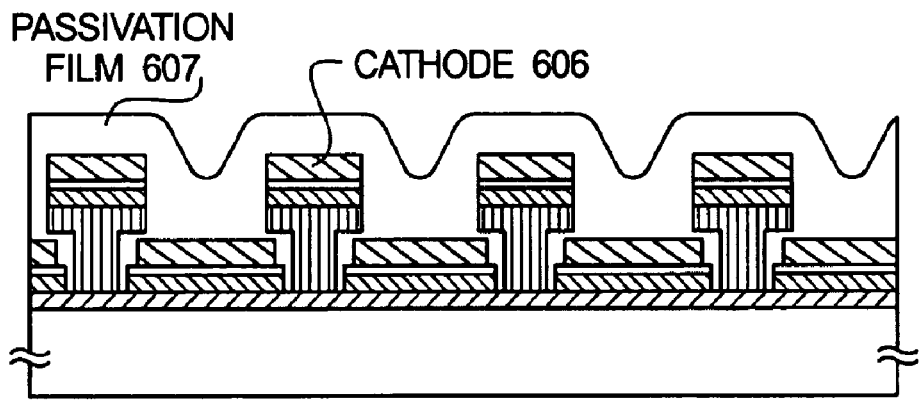

A light emitting device structured as shown in FIG. 6C is thus completed. Thereafter, the EL element is enclosed with a resin or put in an air-tight space in order to protect the EL element against exposure to the outside air. The EL light emitting element thus obtained is high in yield because its manufacturing process is simplified, and the amount of EL material it requires is smaller than the prior art to reduce cost in manufacture.

Shown in this embodiment is a case of employing the structure illustrated in FIGS. 1A to 1C for a passive matrix light emitting device. However, the EL layer 604 may take the structure illustrated in FIGS. 2A to 2C.

Embodiment 4

Figure 7A:
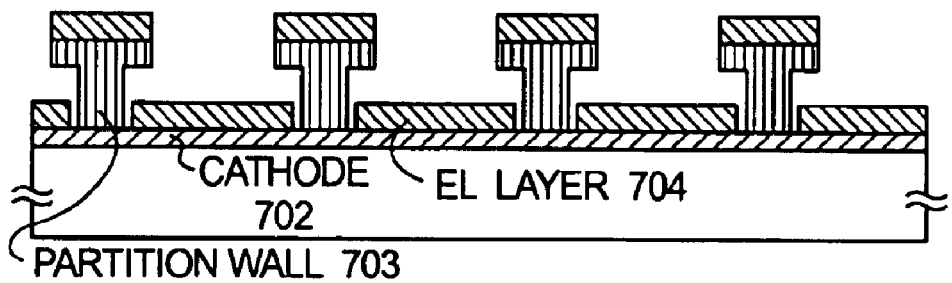
FIGS. 7A to 7C are diagrams showing yet still another process of manufacturing a light emitting device.

Embodiment 4 will describe a case of applying the present invention to a passive matrix EL light emitting device that projects light onto the overhead space of a substrate. First, a cathode 702 is formed on a substrate 701 having an insulating film formed on its surface. Used in this embodiment as the cathode 702 is an electrode having a laminate structure in which an MgAg film (a metal film obtained through coevaporation of magnesium and silver) is laminated on an aluminum film. (FIG. 7A)

The cathode 702 is formed like slips each extending along the width of the drawing. The slips are arranged into a stripe pattern with its stripes laid one after another along the depth of the drawing.

Next, partition walls 703 are formed perpendicular to the stripes of the cathode 702. The partition walls 703 are provided to separate a conductive oxide film that is to serve as an anode. A two-layer resin film is used for each partition wall of this embodiment, and the wall is shaped to form a, letter T in section. This structure can be obtained by etching its lower layer at a higher etching rate than in etching its upper layer.

An EL layer 704 is formed next. The EL layer 704 in this embodiment is formed by evaporation. A material used for the EL layer 704 is Alq$_3$ (tris-8-quinolinolate aluminum complex) that is a monomer organic material. Alq$_3$ may of course be doped with a fluorescent substance to control chromaticity.

Figure 7B:
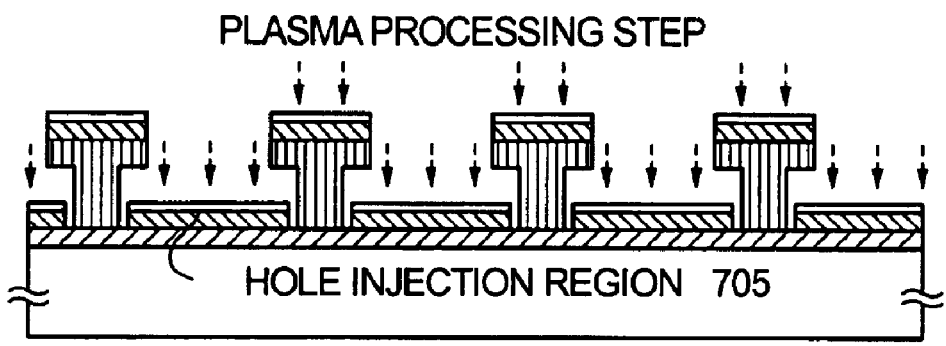

The EL layer 704 is then subjected to plasma processing to form a hole injection region 705. The plasma processing is made by filling the processing chamber with gas containing a halogen element (typically fluorine, chlorine, bromine or iodine) to generate plasma between the electrodes and expose the EL layer 704 to the generated plasma. During the plasma processing, the electrodes are desirably cooled in order to prevent an increase in temperature of the EL layer 704. (FIG. 7B)

A conductive oxide film is formed next from a compound of indium oxide and zinc oxide as an anode 706 to a thickness of 300 nm. At this point, the anode 706 is formed into strips each extending along the depth of the drawing and separated from one another by the partition walls 703. The strips of the anode are laid one after another along the width of the drawing, forming a stripe pattern. A passivation film 707 is formed thereon from a resin film by the ink jet method or printing. It is also effective to laminate a carbon film, specifically, a DLC (diamond-like carbon) film on the passivation film.

Figure 7C:
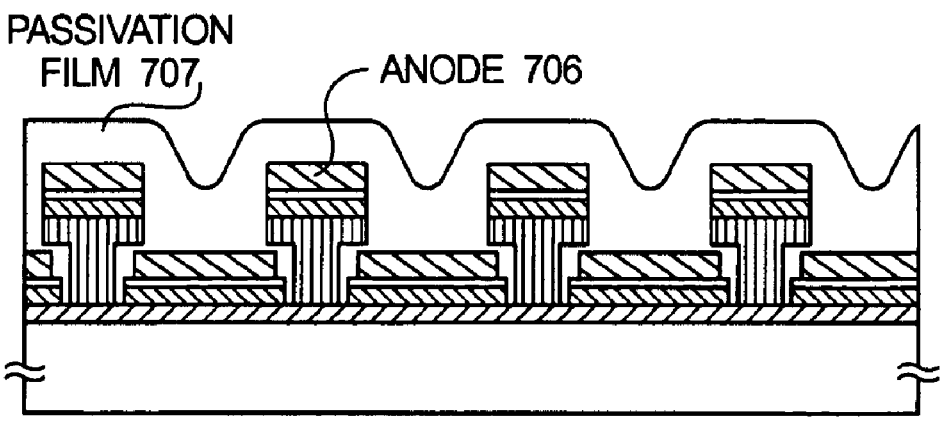

A light emitting device structured as shown in FIG. 7C is thus completed. Thereafter, the EL element is enclosed with a resin or put in an air-tight space in order to protect the EL element against exposure to the outside air. The EL light emitting element thus obtained is high in yield because its manufacturing process is simplified, and the amount of EL material it requires is smaller than the prior art to reduce cost in manufacture.

Shown in this embodiment is a case of employing the structure illustrated in FIGS. 1A to 1C for a passive matrix light emitting device. However, the EL layer 704 may take the structure illustrated in FIGS. 2A to 2C.

Embodiment 5

Figure 8:
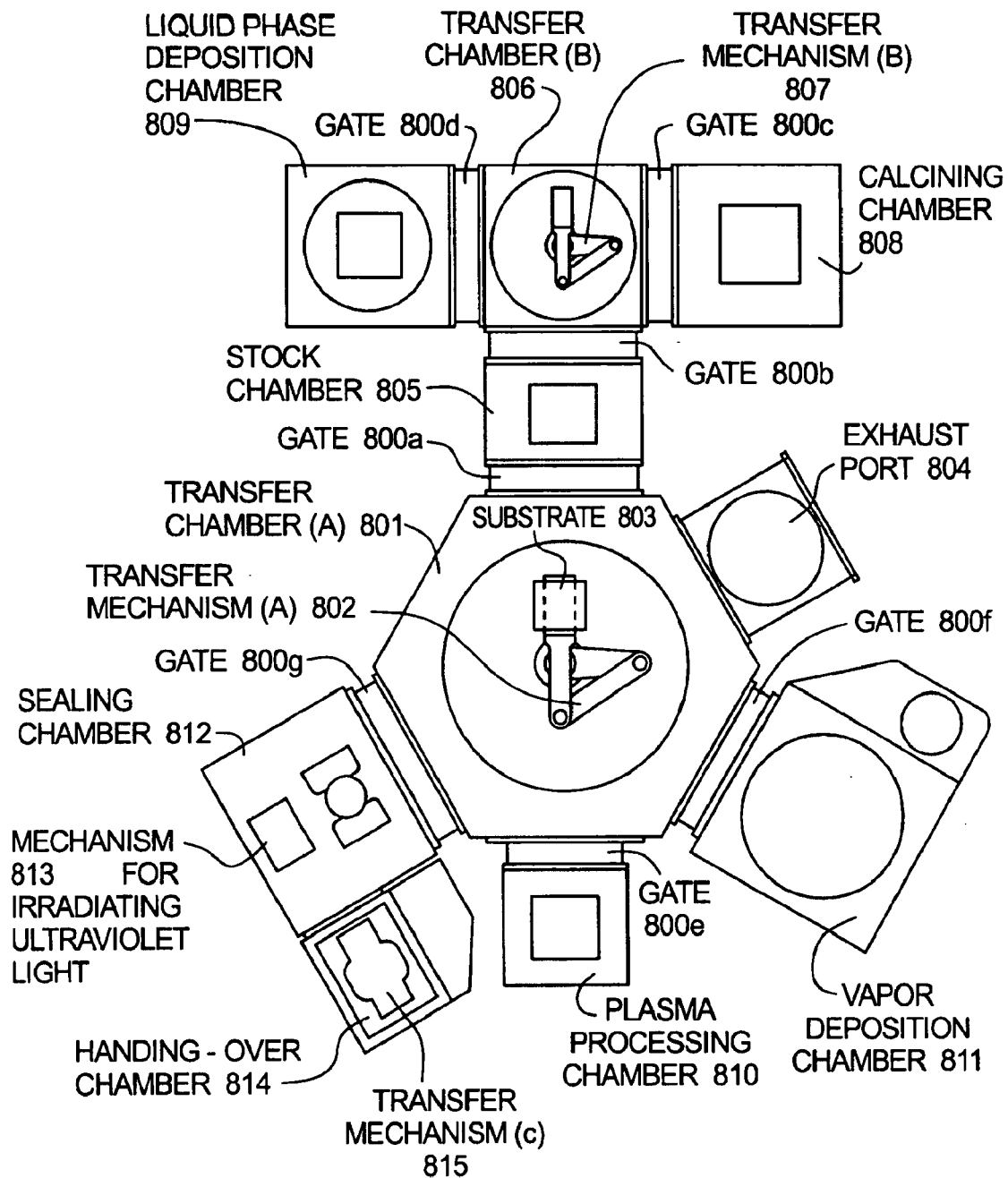
FIG. 8 is a diagram showing the structure of a film forming apparatus.

A film forming apparatus according to the present invention will be described with reference to FIG. 8. In FIG. 8, reference symbol 801 denotes a transfer chamber (A). The transfer chamber (A) 801 is provided with a transfer mechanism (A) 802 to transfer a substrate 803. The interior of the transfer chamber (A) 801 is set to reduced pressure, and the transfer chamber is shut off from each processing chamber by a gate. The transfer mechanism (A) carries the substrate to the processing chambers when their gates are opened. The pressure in the transfer chamber (A) 801 can be reduced by using a vacuum pump such as an oil rotary pump, a mechanical booster pump, a turbomolecular pump, or a cryo pump. Of these, a cryo pump is preferable because it is effective in removing moisture.

In the film forming apparatus of FIG. 8, an exhaust port 804 is provided on a side face of the transfer chamber (A) 801 and the vacuum pump is placed under the port. This structure has an advantage of facilitating maintenance of the vacuum pump.

Descriptions given below are of the various processing chambers. Since the interior of the transfer chamber (A) 801 is set to reduced pressure, every processing chamber that is directly connected to the transfer chamber (A) 801 is provided with a vacuum pump (not shown). The exhaust pump for the processing chambers may be one of the above-mentioned pumps including an oil rotary pump, a mechanical booster pump, a turbomolecular pump, and a cryo pump.

The processing chamber described first is a stock chamber 805 for setting (placing) the substrate, which is also called a load lock chamber. The stock chamber 805 is shut off from the transfer chamber (A) 801 by a gate 800a, and a not-shown carrier in which the substrate 103 is set is placed in the stock chamber. The stock chamber 805 may be divided into two rooms with one room for receiving a substrate and the other for sending out the substrate. The stock chamber 805 is provided with, in addition to the exhaust pump mentioned above, a purge line for introducing nitrogen gas or rare gas of high purity.

In this embodiment, the substrate 103 is set in the carrier with its element forming surface facing downward. When the substrate is set in this manner, later, vapor deposition (film formation through sputtering or evaporation) by the face-down method (also known as deposit-up method) will be easy. The face-down method refers to a method in which a film is formed while the element forming surface of the substrate faces downward, and this method is useful in preventing dust from settling on the substrate.

Turning to the next processing chamber, a transfer chamber (B) 806 is connected to the stock chamber 805 through a gate 800b, and is provided with a transfer mechanism (B) 807. Reference symbol 808 denotes a calcining chamber (baking chamber) connected to the transfer chamber (B) 806 through a gate 800c. The calcining chamber 808 has a mechanism for turning the substrate upside down. With this mechanism, the substrate that has been transferred and arrived here in accordance with the face-down method is turned upside down, thereby switching into the face-up method. This is because the subsequent processing in a liquid phase deposition chamber 809 is carried out in accordance with the face-up method. The substrate that has received the processing in the liquid phase deposition chamber 809 is returned to the calcining chamber 808 so that the substrate is again baked and turned upside down, thereby switching back to the face-down method. The substrate is then returned to the stock chamber 805.

The liquid phase deposition chamber 809 is connected to the transfer chamber (B) 806 through a gate 800d. The liquid phase deposition chamber 809 is a deposition chamber for forming a film containing an EL material by applying a solution containing the EL material to the substrate. The EL material to be deposited includes not only a material used for a light emitting layer but also a material for an electric charge injection layer, an electric charge transportation layer, or an electric charge blocking layer. Any known EL material can be used in the liquid phase deposition chamber.

Given as examples of the EL material to be deposited by liquid phase processing such as spin coating are PPV (polyparaphenylene vinylene) derivatives, PVK (polyvinyl carbazole) derivatives, and polyfluorene derivatives. These derivatives are also called π-conjugated polymers. An appropriate material for the electric charge injection layer is PEDOT (polythiophene) or PAni (polyaniline).

The interior of the liquid phase deposition chamber 809 is desirably set to inert atmosphere. The inert atmosphere thereof may be pressurized (preferably 2 to 3 atm.) to increase the pressure inside the liquid phase deposition chamber 809, whereby oxygen is prevented from mixing in the interior atmosphere.

Next, denoted by 810 is a plasma processing chamber for carrying out the plasma processing according to the present invention. The plasma processing chamber 810 is shut off from the transfer chamber (A) 801 by a gate 800e. Specifics of the plasma processing chamber may be modified in various ways in accordance with a process of manufacturing an EL element. Other than the use in the present invention, the processing chamber can also be used in giving a treatment for improving the surface of a conductive oxide film to serve as an anode of an EL element.

Reference symbol 811 denotes a vapor deposition chamber for forming a conductive film or depositing an EL material by evaporation or sputtering. The vapor deposition chamber 811 is connected to the transfer chamber (A) 801 through a gate 800f. The vapor deposition chamber 811 in this embodiment is an evaporation chamber in which a plurality of evaporation sources can be set. The evaporation sources are evaporated by resistance heating or by an electron beam to form a film.

A conductive film to be formed in the vapor deposition chamber 811 is provided as an electrode serving as a cathode of an EL element. The conductive film is obtained by evaporating a low-work function metal, typically, an element belonging to Group 1 or 2 in the periodic table (represented by lithium, magnesium, cesium, calcium, kalium, barium, sodium, and beryllium), or by evaporating a metal having a work function close to that of the above element. This conductive film may alternatively be a low-resistive one formed by evaporating aluminum, copper, or silver. It may otherwise be a transparent conductive film formed by evaporation from a compound of indium oxide and tin oxide or from a compound of indium oxide and zinc oxide.

Every known EL material (monomer organic EL material, in particular) can be formed in the vapor phase deposition chamber 811. Typical examples of the material for a light emitting layer include Alq$_3$ (tris-8-quinolinolate aluminum complex) and DSA (distyryl arylene derivative). Typical examples of the material for an electric charge injection layer include CuPc (copper phthalocyanine), LiF (lithium fluoride) and acacK (kalium acetylacetonate). Typical examples of the material for an electric charge transportation layer include TPD (triphenylamine derivative) and NPD (anthracene derivative).

The EL materials above may be evaporated together with a fluorescent substance (typically, coumarin 6, rubrene, Nile red, DCM, quinacridone, etc.). Any known fluorescent substance can be used. It is also possible to coevaporate the EL material and an element belonging to Group 1 or 2 in the periodic table so that a part of the light emitting layer plays a role of the electric charge transportation layer or the electric charge injection layer. The term coevaporation refers to evaporation in which two or more evaporation sources are simultaneously heated to mix the different substances thereof and to deposit the mixed substances.

In any case, deposition of an organic EL material, or formation of a conductive film, is carried out while the vapor deposition chamber 811 is closed to the transfer chamber (A) 801 by the gate 800f to make the interior of the chamber 811 vacuum. The deposition in this chamber employs the face-down method (deposit-up method).

The next processing chamber is a sealing chamber (also called as enclosure chamber or glove box) 812. The sealing chamber 812 is connected to the transfer chamber (A) 801 through a gate 800g. In the sealing chamber 812, the final processing of enclosing the EL element in an air-tight space is conducted. This processing is for protecting the formed EL element against oxygen and moisture. Specifically, the EL element is enclosed with a sealing member mechanically, or with a thermally-curable resin or a UV-curable resin.

The sealing member can be formed from a material such as glass, ceramics and metals, but the material has to be light-transmissive if the EL element emits light toward the sealing member side. The sealing member is bonded to the substrate on which the EL element is formed by curing a thermally-curable resin or a UV-curable resin through heat treatment or irradiation of ultraviolet light. The air-tight space is thus formed. It is also effective to place a drying agent such as barium oxide and an antioxidant in this air-tight space.

The space between the sealing member and the substrate on which the EL element is formed may be filled with a thermally-curable resin or a UV-curable resin. In this case, to add a drying agent such as barium oxide in the thermally-curable resin or the UV-curable resin is effective.

In the film forming apparatus shown in FIG. 8, the sealing chamber 812 has therein a mechanism 813 for irradiating ultraviolet light (hereinafter referred to as ultraviolet light irradiation mechanism). The ultraviolet light irradiation mechanism 813 emits ultraviolet light to cure the UV-curable resin. The works in the sealing chamber 812 can be done manually by gloved hands or, preferably, through automation controlled by computers. When the sealing member is employed, the film forming apparatus is preferably provided with a mechanism for applying a sealing agent such as one used in assembling cells of a liquid crystal device (a thermally-curable resin or a UV-curable resin is used here), a mechanism for bonding the sealing member to the substrate, and a mechanism for curing the sealing agent.

The interior of the sealing chamber 812 may be set to reduced pressure if a vacuum pump is provided. When the above sealing step is automated through operation of robots, the reduced pressure in the sealing chamber prevents oxygen and moisture from entering the chamber. Alternatively, the interior of the sealing chamber 812 may be pressurized. In this case, it is pressurized while being purged with nitrogen gas or rare gas of high purity to prevent oxygen and the like of the outside air from entering the chamber.

Next, a handing-over chamber (pass box) 814 is connected to the sealing chamber 812. The handing-over chamber 814 is provided with a transfer mechanism (C) 815, which brings the substrate whose EL element has been enclosed through the processing in the sealing chamber 812 into the handing-over chamber 814. The interior of the handing-over chamber 814 may also be set to reduced pressure if a vacuum pump is provided. The handing-over chamber 814 is provided to avoid direct exposure of the sealing chamber 812 to the outside air, and the substrate is taken out from the handing-over chamber.

As has been described in the above, the film forming apparatus shown in FIG. 8 is capable of keeping the substrate away from the outside air until after the EL element is completely enclosed in an air-tight space. Moreover, almost oxygen-less deposition is possible in the liquid phase deposition chamber 809 where an organic EL material is deposited in inert atmosphere having extremely low oxygen concentration. These make the film forming device capable of manufacturing an EL light emitting apparatus of higher reliability compared to the prior art.

Embodiment 6

In this embodiment, an external light emitting quantum efficiency can be remarkably improved by using an EL material by which phosphorescence from a triplet exciton can be employed for emitting a light. As a result, the power consumption of the EL element can be reduced, the lifetime of the EL element can be elongated and the weight of the EL element can be lightened.

The following is a report where the external light emitting quantum efficiency is improved by using the triplet exciton (T. Tsutsui, C. Adachi, S. Salto, Photochemical processes in Organized Molecular Systems, ed. K. Honda, (Elsevier Sci. Pub., Tokyo, 1991) p. 437).

The molecular formula of an EL material (coumarin pigment) reported by the above article is represented as follows.

(Chemical formula 1)

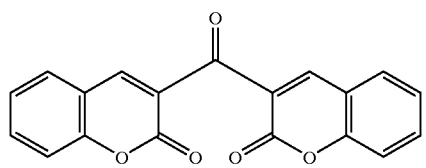

(M. A. Baldo, D. F. O'Brien, Y. You, A. Shoustikov, S. Sibley, M. E. Thompson, S. R. Forrest, Nature 395 (1998) p.151)

The molecular formula of an EL material (Pt complex) reported by the above article is represented as follows.

(Chemical formula 2)

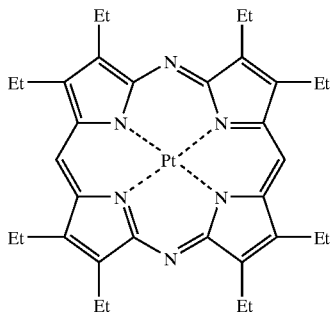

(M. A. Baldo, S. Lamansky, P. E. Burrows, M. E. Thompson, S. R. Forrest, Appl. Phys. Lett., 75 (1999) p.4.) (T. Tsutsui, M. -J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502)

The molecular formula of an EL material (Ir complex) reported by the above article is represented as follows.

(Chemical formula 3)

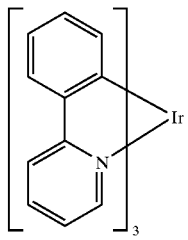

As described above, if phosphorescence from a triplet exciton can be put to practical use, it can realize the external light emitting quantum efficiency three to four times as high as that in the case of using fluorescence from a singlet exciton in principle. The structure according to this embodiment can be freely implemented in combination of any structures of the first to tenth embodiments.

Embodiment 7

The light emitting apparatus formed according to the present invention, is a self light emitting type, therefore compared to a liquid crystal display device, it has excellent visible properties and is broad in an angle of visibility. Accordingly, it may be used as a display portion of various electric devices. In such a case, since the light emitting apparatus of this invention is a passive type light emitting device but may have a large size screen by decreasing the wiring resistance, it may be used in various situations.

As other electronic equipments of the present invention there are: a video camera; a digital camera; a goggle type display (head mounted display); a car navigation system; a car audio stereo; a notebook type personal computer; a game apparatus; a portable information terminal (such as a mobile computer, a portable telephone, a portable game machine, or an electronic book); and an image playback device equipped with a recording medium (specifically, device provided with a display portion which plays back images in a recording medium such as a compact disc player (CD), a laser disk player (LD), or a digital versatile disk Player (DVD), and displays the images). Specific examples of those electronic equipments are shown in FIGS. 9A to 10B.

Figure 9A:
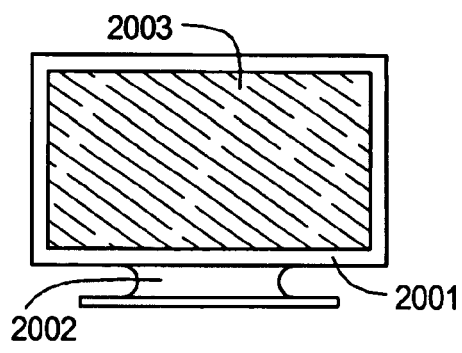
FIGS. 9A to 9F are diagrams showing examples of an electric machine.

FIG. 9A shows an EL display containing a casing 2001, a support stand 2002, and a display portion 2003. The light emitting device of the present invention can be used as the display portion 2003. Such an EL display is a self light emitting type so that a back light is not necessary. Thus, the display portion can be made thinner than that of a liquid crystal display.

Figure 9B:
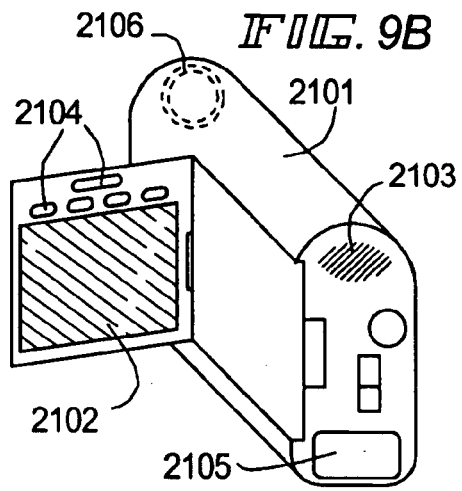

FIG. 9B shows a video camera, and contains a main body 2101, a display portion 2102, a sound input portion 2103, operation switches 2104, a battery 2105, and an image receiving portion 2106. The light emitting device of the present invention can be used as the display portion 2102.

Figure 9C:
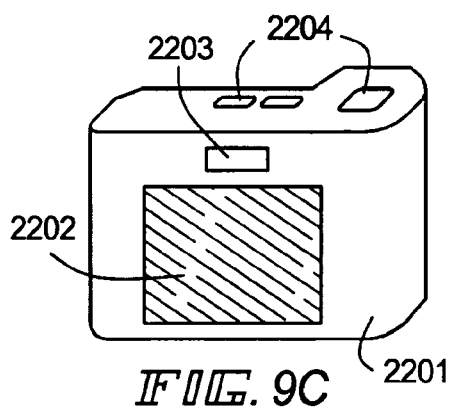

FIG. 9C shows a digital camera, and contains a main body 2201, a display portion 2202, an eye piece portion 2203, and operation switches 2204. The light emitting device of the present invention can be used as the display portion 2202.

Figure 9D:
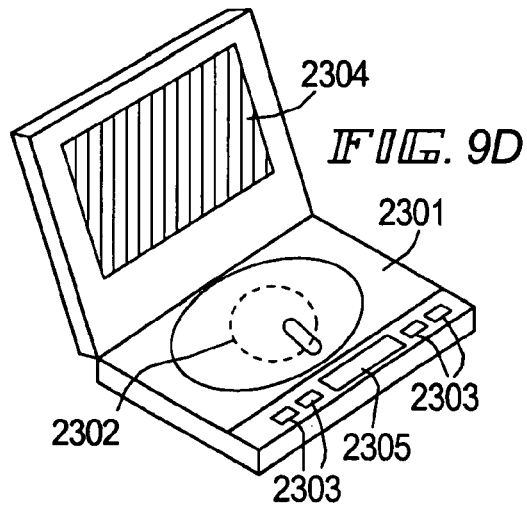

FIG. 9D is an image playback device equipped with a recording medium (specifically, a DVD playback device), and contains a main body 2301, a recording medium (such as a CD, LD or DVD) 2302, operation switches 2303, a display portion (a) 2304, and a display portion (b) 2305. The display portion (a) 2304 is mainly used for displaying image information. The display portion (b) 2305 is mainly used for displaying character information. The light emitting device of the present invention can be used as the display portion (a) 2304 and as the display portion (b) 2305. Note that the image playback device equipped with the recording medium includes devices such as CD playback devices and game machines.

Figure 9E:
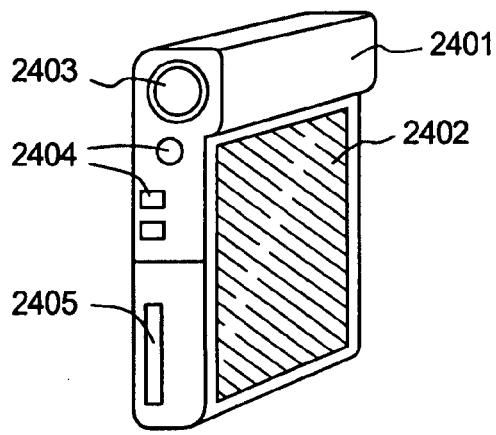

FIG. 9E shows a portable (mobile) computer, and contains a main body 2401, a camera portion 2402, an image receiving portion 2403, operation switches 2404, and a memory slot 2405. The electrooptical device of the present invention can be used as the display portion 2402. This portable computer can record or playback information in the recording medium which is an accumulation of flash memory or non-volatile memory.

Figure 9F:
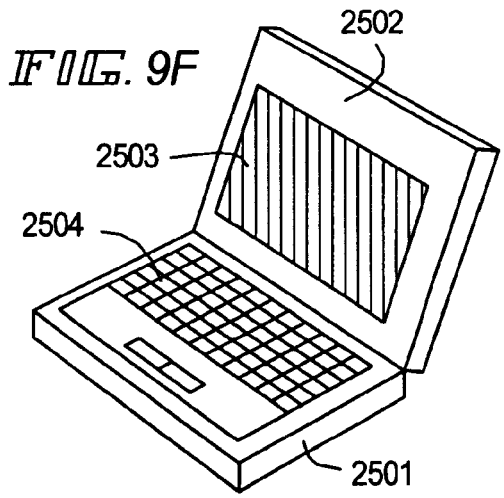

FIG. 9F is a personal computer, and contains a main body 2501, a casing 2502, a display portion 2503, and a keyboard 2504. The light emitting device of the present invention can be used as the display portion 2503.

Note that if the luminance of the EL material increases in the future, then it will become possible to use the light emitting device of the present invention in a front type or a rear type projector by expanding and projecting light containing output image information with a lens or the like.

Further, the above electric devices display often information transmitted through an electronic communication circuit such as the Internet and CATV (cable tv), and particularly situations of displaying moving images is increasing. The response speed of EL materials is so high that the above electric devices are good for display of moving image.

In addition, since the light emitting device consumnes power in the light emitting portion, it is preferable to display information so as to make the light emitting portion as small as possible. Consequently, when using the light emitting device in a display portion mainly for character information, such as in a portable information terminal, in particular a portable telephone or a car audio stereo, it is preferable to drive the light emitting device so as to form character information by the light emitting portions while non-light emitting portions are set as background.

Figure 10A:
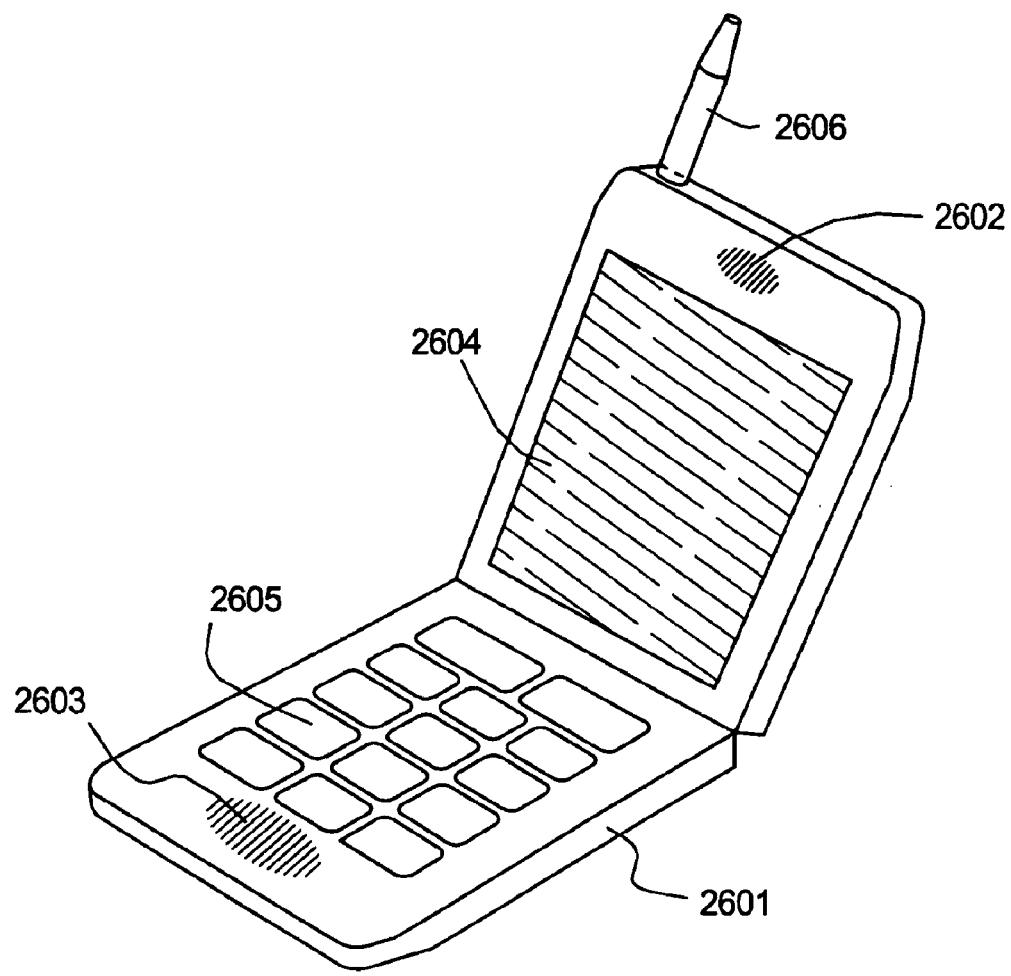
FIGS. 10A and 10B are diagrams showing examples of an electric machine.

FIG. 10A shows a portable telephone, and contains a main body 2601, a sound output portion 2602, a sound input portion 2603, a display portion 2604, operation switches 2605, and an antenna 2606. The light emitting device of the present invention can be used as the display portion 2604. Note that by displaying white color characters in a black color background, the display portion 2604 can suppress the power consumption of the portable telephone.

Figure 10B:
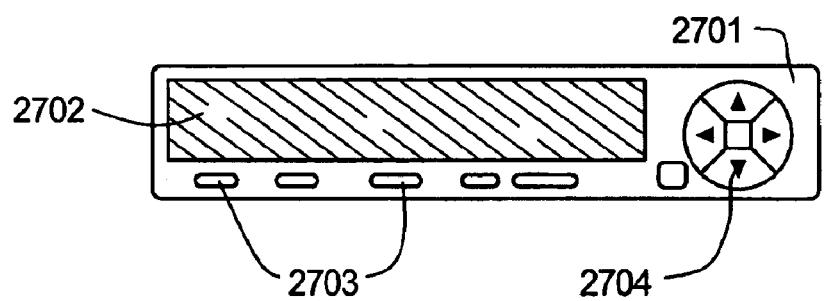

FIG. 10B shows a car audio stereo, and contains a main body 2701, a display portion 2702, and operation switches 2703 and 2704. The light emitting device of the present invention can be used as the display portion 2702. Further, a car mounting, audio stereo is shown in this embodiment, but a fixed type audio playback device may also be used. Note that, by displaying white color characters in a black color background, the display portion 2704 can suppress the power consumption. Note that, if a stick driver is provided in the light emitting device used in the display portion 2704, it is preferable that it is dividedly provided in several parts.

As described above, the application range of this invention is extremely wide, and it may be used for electric devices in various fields. Further, the electric device of this embodiment may be obtained by using a light emitting device freely combining the structures of the first to sixth embodiments.

Carrying out the present invention makes it possible to reduce the number of layers that constitute an EL layer while maintaining, or even improving, the performance of an EL element. Thus an EL light emitting device can be manufactured at a reduced cost, providing an inexpensive EL light emitting device. Moreover, product cost of an electric machine that uses the inexpensive EL light emitting device as its display unit can be reduced.

What is claimed is:

1. A method of manufacturing a light emitting device, comprising:

forming an anode over an insulator;

forming a first EL layer comprising an organic EL material over the anode;

forming a second EL layer in the first EL layer by subjecting the first EL layer to a plasma processing; and forming a cathode over the second EL layer subjected to the plasma processing, wherein a plasma generated by the plasma processing comprises a halogen element.

2. A method of manufacturing a light emitting device, comprising:

forming a cathode over an insulator, forming a first EL layer comprising an organic EL material over the cathode;

forming a second EL layer in the first EL layer by subjecting the first EL layer to a plasma processing; and forming an anode over the second EL layer subjected to the plasma processing, wherein a plasma generated by the plasma processing comprises a halogen element.

3. A method according to claim 1, wherein the halogen element is selected from the group consisting of fluorine, chlorine, bromine and iodine.

4. A method according to claim 2, wherein the halogen element is selected from the group consisting of fluorine, bromine and iodine.

5. A method according to claim 1, wherein the first EL layer includes an organic material that emits light through triplet excitation.

6. A method according to claim 2, wherein the first EL layer includes an organic material that emits light through triplet excitation.

7. A method according to claim 1, wherein said light emitting device is incorporated into one selected from the group consisting of an EL display, a video camera, a digital camera, an image playback device, a mobile computer, a personal computer, a portable telephone, and a car audio stereo.

8. A method according to claim 2, wherein said light emitting device is incorporated into one selected from the group consisting of an EL display, a video camera, a digital camera, an image playback device, a mobile computer, a personal computer, a portable telephone, and a car audio stereo.

* * * * *